United States Patent [19]

Lorenz

[11] 4,052,622
[45] Oct. 4, 1977

[54] CHILD'S LAMP AND AUDIO DEVICE

[76] Inventor: Michael Lorenz, 421 55th St., Downers Grove, Ill. 60515

[21] Appl. No.: 747,400

[22] Filed: Dec. 3, 1976

[51] Int. Cl.² .......................................... H01H 7/00
[52] U.S. Cl. .................................. 307/112; 307/141; 361/202
[58] Field of Search .................. 307/141.4, 141.8, 141, 307/112, 113, 114, 115; 315/360, DIG. 4; 317/141 R; 58/21.15 S; 335/184, 267, 136; 361/202

[56] References Cited
U.S. PATENT DOCUMENTS
2,907,901  10/1959  Parker .................................. 307/141

Primary Examiner—Robert K. Schaefer
Assistant Examiner—Morris Ginsburg
Attorney, Agent, or Firm—McWilliams & Mann

[57] ABSTRACT

A child's lamp and sound source including a light and a tape deck, or the like, controlled by a timer mechanism mechanically actuating either a dimmer for the light or a potentiometer for varying the sound level of the tape deck. Electrical circuitry including solenoids for controlling the tape deck and light automatically also provides for manual control of the potentiometer and dimmer.

3 Claims, 2 Drawing Figures

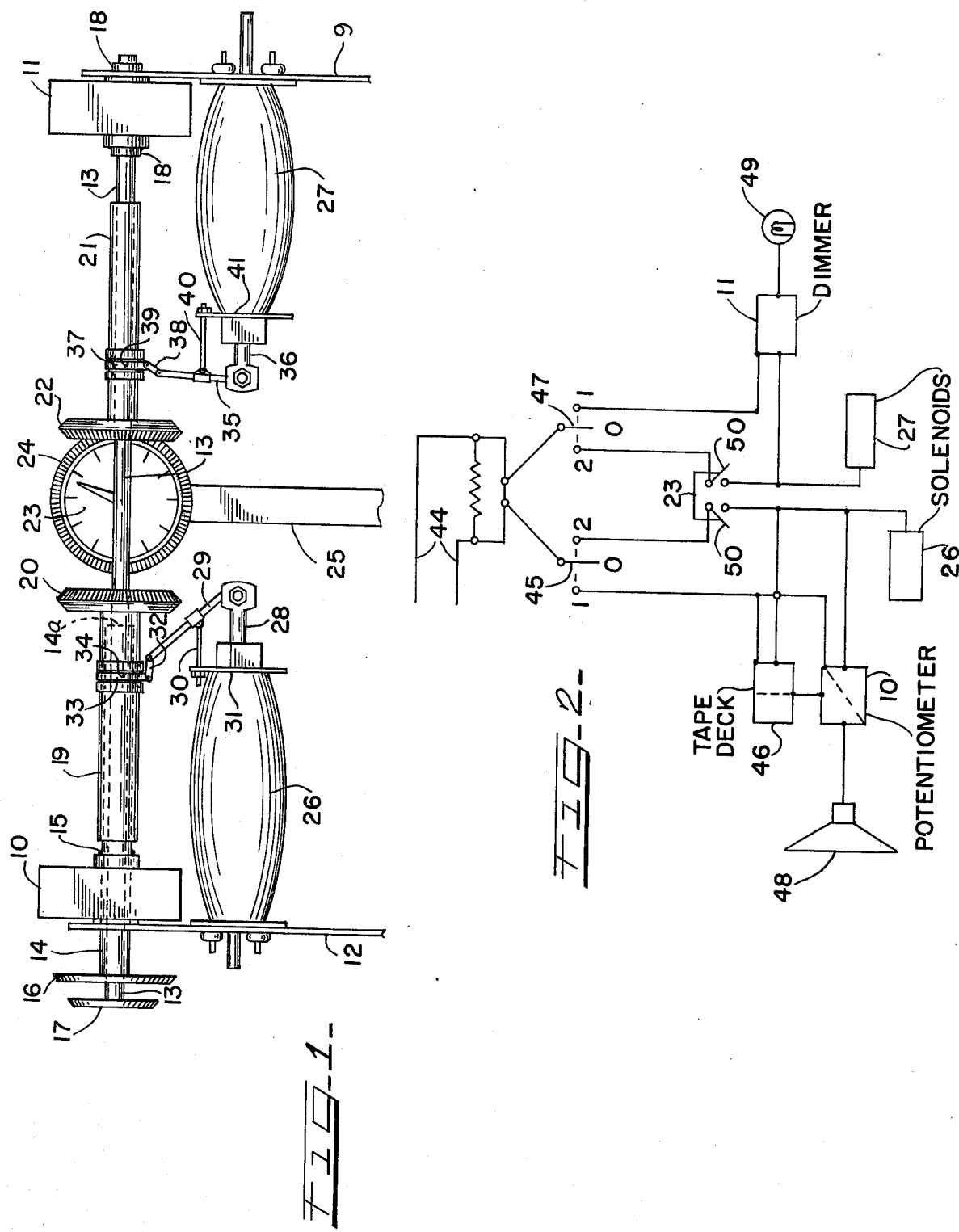

CHILD'S LAMP AND AUDIO DEVICE

BACKGROUND OF THE INVENTION

The prior art discloses various clock radios and alarms incorporating timing mechanisms, or devices to turn a radio on, or off, at present times, or to actuate the alarm. Certain radios of these prior types included a light which was adapted to be flashed on and off and thereby function as a wake-up signal to a sleeping person. Other types of prior art radios included a so-called "slumber switch" which was utilized to turn the radio on and then after the expiration of a selected period of time, when the user presumably has fallen asleep, to turn the radio off. The slumber switch on such radios was adapted to be utilized without affecting the alarm setting on the radio. It was known too, in clock radios, that multiple sets of volume and station selector controls might be utilized, so that when a timer mechanism activated the radio it would operate at the preselected station and at the chosen volume and which operation could be obtained independently of a separate set of tuning and volume controls. One type of prior clock radio was known which provided a timer mechanism that activated the radio for a certain period of time and during this time period uniformly decreased the volume level, to zero, and after which period to radio was turned off. When the radio was turned on again, automatically, as a wake-up alarm, the mechanism caused the volume gradually to increase from the zero position, or volume level, to its previous setting.

Another prior patent disclosure reveals a light alarm system associated with an electric clock so that the light was activated at a preset time as a wake-up alarm controlled by the clock mechanism. When activated, the light operated at a low light level and gradually increased in brightness from this minimum setting until full brightness was attained as a simulation of daylight. Another patent from the prior art utilizes a timer cam which functions on a twenty four hour basis and utilizies a gear that turns a radio on or off. Another prior art inventor uses two switches, one to turn his system on and one to turn on a dimming device. Certain of such prior arrangements were not controllable manually and where both audible alarm and lights were used they were directed through the same control device.

SUMMARY OF THE INVENTION

This invention provides a timing mechanism in assoication with a tape deck, or the like and a lamp to control the sound output level of the tape deck as well as the light level of the lamp automatically and whereby the volume level of the tape deck and the light level may be varied simultaneously, or individually, over a predetermined or preset period of time. The output of the tape deck and the brightness of the lamp may be preset to diminish simultaneously, or to raise the volume and increase the light level together, but also affording independent operation of either the tape deck, or the lamp. The invention utilizes a potentiometer for regulating the volume of the tape deck and/a dimmer device for controlling the light level of the lamp mounted at opposite ends of an operating shaft with mechanism for operatively connecting either the potentiometer or the dimmer, or both, to a dimmer mechanism and having individual solenoids in an electrical circuit for effecting such connections. The operating shaft mechanism also includes means for actuating the potentiometer and the dimmer manually and independently of each other and the electrical circuitry affords means for operating the system fully automatically whereby the timing mechanism may be utilized with the tape deck and the lamp to enable either to be set for automatic operation for any preset period of time within the capacity of the timer mechanism. The volume, or audio output, of the tape deck and the brightness of the lamp will be regulated according to the setting of the controls. However, the arrangement is such that is may be used as a continuous tape player with manual volume control, or it may be used strictly as a night light, with manual control. Either the tape deck or the lamp may be used independently of the other on fully automatic operation, if desired.

OBJECTS OF THE INVENTION

It is the primary purpose of the invention to provide an electromechanical system of controlling the sound level of an audio device and the light level of a lamp in a child's room for regulating such levels during periods of sleep and when the child is awakening.

The principal cbject of the invention is the provision of an electromechanical control arrangement for automatically or manually regulating the sound and light levels of an audio device and a lamp.

An important object of the invention is to provide an audio device and a lamp under control of a timer mechanism operating in conjunction with a potentiometer and a dimmer device for regulating the audio and light output thereof and operable manually independently of the timer mechanism.

Another object of the invention is the provision of potentiometer and dimmer means for regulating the output levels of an audio device and a lamp in association with a timer mechanism which permits of manual operation thereof, or provides for automatic operation of one, or both, in combination with electrical circuitry, including solenoids for operatively connecting the potentiometer and dimmer with the timer, or disconnecting one, or both, from the timer.

A further object of the invention is to provide an arrangement for regulating the sound and light levels of an audio device and a lamp including a potentiometer and a dimmer operatively connected by mechanism which provides for connection of either one, or both, the potentiometer and dimmer to a timer device for automatic operation of one, or both, and which provides for manual operation of either, with solenoids in an electrical circuit for effecting the connection, or disconnection.

A still further object of the invention is the provision of an arrangement for regulating the sound and light levels of an audio device and a lamp including a potentiometer and a dimmer operatively connected by a shaft with means on the shaft actuated by separate solenoids to connect the potentiometer and/or the dimmer with a timer mechanism and having means associated with the shaft for actuating the potentiometer and dimmer manually and independently of each other.

DESCRIPTION OF THE DRAWINGS

The foregoing and other and more specific objects of the invention are attained by the mechanism and arrangement illustrated in the accompanying drawings wherein FIG. 1 is a generally schematic illustration of a mechanism for operatively connecting a potentiometer and a dimmer with a timer mechanism and operable automatically, or manually, with separate solenoids for effecting the connections, or disconnections; and FIG. 2 is a schematic wiring diagram of an electrical circuitry for effecting the complete operation of the system for regulating the sound and light levels.

DESCRIPTION OF PREFERRED EMBODIMENT

In the drawings, as best shown in FIG. 1, a potentiometer 10 and a dimmer 11 are mounted in axial alignment on supporting brackets 12 and 9, respectively. The potentiometer and dimmer are operatively connected by a shaft mechanism including a central shaft 13 which serves also as a control shaft for manually actuating the dimmer 11. The potentiometer 10 may be actuated manually by means of a control shaft 14 which is of tubular section, fitting over the shaft 13 and rotatable relative thereto. The tubular shaft 14 passes through the potentiometer and is operatively connected thereto as at 15 so that when the shaft 14 is rotated, independently of the shaft 13, the potentiometer is also rotated. Operating handle 16 on the shaft 14 provides means for rotating the shaft while handle 17 on the shaft 13 provides means for rotation of that shaft.

It will be seen that the central shaft 13 extends entirely through the shaft mechanism for connection directly to the dimmer 11 as at 18 and passes through the dimmer with a similar connection 18 at the outer side thereof whereby the dimmer may be readily rotated by means of the operating handle 17. It will be seen that the potentiometer control shaft 14 extends inwardly to a position approaching a median point of the mechanism, but stopping short of the actual middle of the shaft 13, as at 14a. A sleeve 19 is slidably mounted on shaft 14 for movement axially of the shaft but which is prevented from rotating relative to the shaft 14 by means of a keyway (not shown) which permits relative sliding movement axially but positively locks the tubular shaft 14 and the sleeve 19 encircling the shaft, against relative rotation. At its inner end the sleeve 19 is provided with a bevel gear 20 more fully hereinafter to be described.

A sleeve 21 is mounted on the dimmer control shaft 13 and is axially slidable thereon but is prevented from relative rotation with respect thereto by means of a keyway (not shown) which positively locks the sleeve 21 and shaft 13 against relative rotation but permits the sleeve to slide axially of the control shaft. A bevel gear 22 is provided on the inner end of the tubular sleeve 21 similar to the gear 20 on the tubular sleeve 19 but in opposite relation thereto. Centrally between the potentiometer 10 and the dimmer 11 a timer mechanism 23, including a bevel gear wheel 24, is mounted on a bracket 25 in position for the gear wheel to mesh with one or the other, or both of the bevel gears 20 and 22 whereby the potentiometer 10 and the dimmer 11 can be placed under the control of the timer and their operation regulated thereby.

The bevel gears 20 and 22, mounted on the respective sliding sleeves 19 and 21, are adapted to be moved into meshing engagement with the gear wheel 24 by means of solenoids 26 and 27 respectively, whereby the potentiometer 10, or the dimmer 11, can be placed under the control of the timer 23. The respective solenoids are mounted on the brackets 12 and 9 directly below the associated potentiometer or the dimmer, as shown in FIG. 1 and actuate the sliding sleeves 19 and 21 through suitable lever mechanisms which move the sleeves axially on the shafts 14 and 13 to engage, or disengage, the gears 20 and 22 with respect to the gear wheel 24. The solenoid arm 28 is pivotally connected with a lever 29 which is fulcrummed intermediate its ends on a pivot member 30 projecting from a mounting bracket 31 secured to the solenoid 26. The pivot member 30 is rigidly secured to the bracket 31 which is located adjacent to the inner end of the solenoid.

A link 32 connects the opposite end of the lever 29 to a freely rotative ring, or collar member 33, encircling the sleeve 19 and which enables the sleeve member to be moved axially on the shaft 14 while the sleeve and the shaft are left free to be rotated by means of the operating handle 16, or by the gear 20 when it is operatively meshed with the gear wheel 24. The ring 33 rides in a groove 34 which encircles the sleeve 19 and enables the sleeve to be rotated freely in the ring but enables the sleeve to be moved axially on the shaft 14 by means of the solenoid actuated lever mechanisms 29/32. Thus the solenoid 26 can act to engage the gear 20 with the gear wheel 24 to operate the potentiometer from the timer 23 or, the gears may be disengaged by the operation of the solenoid whereby the potentiometer may be adjusted manually through the medium of the operating handle 16.

A lever 35 operatively connects the solenoid arm 36 of the solenoid 27 with a ring, or collar 37 on the sleeve 21, through a connecting link 38, whereby the solenoid can operate to move the sleeve and the associated bevel gear 22 axially on the shaft 13. The ring 37 rides in a groove 39 that encircles the sleeve 21 similarly to the groove 34 in the sleeve 19, so that the sleeve 21 is free to rotate in the ring 39 under the impetus of the timer mechansim 23 through the gears 24 and 22 or, when the gears are disengaged the shaft 13 and the associated sleeve 21 can be rotated manually by means of the operating handle 17 to adjust the dimmer 11. The lever 35 fulcrums intermediate its ends on a pivot member 40 rigidly secured to a mounting bracket 41 secured adjacent the inner end of the solenoid 27. Thus, this solenoid can function similarly to the opposite solenoid, to move the bevel gear 22 on the sleeve 21 into and out of operating engagement with the timer actuated gear 24 to place the dimmer 11 under the control of the timer mechanism or, the dimmer can be left free to be adjusted manually be means of the through shaft 13 and operating handle 17.

The solenoids 26 and 27 are disposed in an electrical circuit powered from a source of A.C. current 44 as shown schematically in FIG. 2. As shown in this diagram it will be seen that a single pole, double throw switch 45 is in circuit with a tape deck 46, the potentiometer 10 and the solenoid 26, while a similar single pole, double throw switch 47 is in circuit the dimmer 11 and the solenoid 27. Switches 45 and 47 are operable independently of each other and when the switch 45 is in the off position at 0 the tape deck 46, potentiometer 10 and solenoid 26 will not be operative so that audio production will not be available while the switch is disposed in this position. However, when the switch 45 is placed in its active position at 1 the tape deck 46 and potentiometer 10 will be activated so that audio production is had and in this position of the switch, volume control is obtained by manual adjustment of the potentiometer 10 through operation of the shaft 14 by means of the handle 16, the solenoid 26 being inactive in position 1 of the switch 45. Under these conditions the potentiometer control shaft 14 is free to be rotated manually with the bevel gear 20 disengaged from the timer gear wheel 24, as shown in FIG. 1. A speaker 48 is disposed in the audio circuit with the tape deck 46 and potentiometer 10 and projects sound generated at the tape deck under volume control exerted by the potentiometer.

Position 1 of switch 47 also is the manual operating position for the dimmer 11 and lamp 49 and when the switch is disposed in the off position 0 the dimmer 11 and the solenoid 27 are deactivated so that no light is to be had at the lamp 49. However, in position 1 of switch 47 the dimmer is activated and brightness of the light given by lamp 49 can be adjusted manually by rotating the dimmer through the medium of through operating shaft 13 by the handle 17, solenoid 27 being deactivated in this position of the switch 47. In FIG. 1 the bevel gears 20 and 22 are shown in positions as though the switch 45 is in its position 1 with switch 47 in its position 2, where the gear 22 will be engaged with gear wheel 24 on the timer, but in position 1 of switch 47 the gears will be disengaged just as in the case of gear 20 in this Figure to provide for manual operation.

When either switch 45 or switch 47 is disposed in its position 2 a double-pole double-throw switch 50 will be activated, but since this switch is a double-pole double-throw type of switch the power continues to be directed independently to the respective functions of switches 45 and 47. The double-pole double-throw switch 50 is opened by activating the timer 23. When switch 45 is placed in its position 2 the double-pole double-throw switch 50 is entergized but remains open. However, when timer 23 is activated switch 50 closes thereby directing power to tape deck 46, potentiometer 10 and solenoid 26. The solenoid 26, as indicated in FIG. 1 and hereinbefore described, then engages the potentiometer bevel gear 20 with the gear wheel 24, actuated by the timer, so that as the timer slowly rotates to its deactivated condition, the timer gear 24 turn the potentiometer gear 20 thereby automatically reducing the volume gradually at the speaker 48 until the timer 23 is totally deactivated thus opening the double-pole double-throw switch 50 and thereby deactivating the system.

The lighting system functions similarly with the power being directed through the double-pole double-throw switch 50 to the dimmer 11 and the solenoid 27 to regulate the operation of lamp 49. When switch 47 is placed in its position 2 the double-pole double-throw switch 50 is activated but remains open as described in reference to the audio phase of the system. However, when the timer mechanism 23 is activated, the switch 50 closes and thereby directs power to the dimmer 11 and associated lamp 49 and the solenoid 27. Solenoid 27 operates to engage the bevel gear 22, which is operatively associated with the dimmer 11, with the timer actuated gear wheel 24 so that as the timer mechanism slowly rotates to its deactivated position the timer gear 24 turns the dimmer gear 22, thereby automatically and gradually reducing the brightness of the lamp 49 by rotating the dimmer 11, and continues to reduce the lamps brightness until the timer 23 is fully deactivated thus opening the switch 50 and thereby deactivating the entire system.

Both of the switches 45 and 47 can be activated to cause the tape deck 46 and the lamp 49 to be operated at the same time under the control of the timer mechanism 23 whereby the volume control of the tape deck 46 and speaker 48 and the brightness control of the lamp 49 can be regulated simultaneously and at the same rate. If desired, relays may be installed between the potentiometer 10 and its solenoid 26 and between the dimmer 11 and its associated solenoid 27 so that when the potentiometer or the dimmer become completely deactivated the associated solenoids 26 and 27 will also be deactivated whereby to afford the timer mechanism 23 its freedom to deactivate the system.

What is claimed is:

1. An electromechanical control arrangement for regulating the sound and light levels of an audio device and a lamp including a timer mechanism in combination with a potentiometer and dimmer device, said potentiometer and dimmer device being mounted in operative association with coaxial shafts disposed therebetween whereby the potentiometer and dimmer device can be actuated separately, a potentiometer drive member and a drive member for the dimmer device slidingly mounted on said shafts, said timer mechanism having a driving member, a pair of solenoids adapted to move said drive members into operative engagement with said driving member, and an electrical circuitry having a source of current whereby the solenoids may be activated to connect the potentiometer and dimmer device with the timer mechanism or to disconnect one or both from the timer mechanism.

2. An electromechanical control arrangement as set forth in claim 1 wherein said coaxial shafts each has a manual control for actuating the potentiometer and the dimmer device respectively independently of said solenoids.

3. An electromechanical control arrangement as set forth in claim 1 wherein said electrical circuitry includes a switch controlling the circuitry to said audio device and potentiometer and one of said solenoids, a switch controlling the circuitry to said dimmer device and the other solenoid, and a double-pole double-throw switch activated by either of said first named switches, said double-pole double-throw switch being rendered operative by said timer mechanism.

* * * * *